US010438978B2

(12) United States Patent
Bryla et al.

(10) Patent No.: US 10,438,978 B2
(45) Date of Patent: Oct. 8, 2019

(54) MEASURING HARVESTED ENERGY USING AN ULTRA-LOW DUTY CYCLE MEASUREMENT SYSTEM

(71) Applicant: Sargent Manufacturing Company, New Haven, CT (US)

(72) Inventors: Mark Bryla, Cumming, GA (US); Michael Lorello, Guilford, CT (US); John C. Wren, Flowery Branch, GA (US)

(73) Assignee: SARGENT MANUFACTURING COMPANY, New Haven, CT (US)

( * ) Notice: Subject to any disclaimer, the term of this patent is extended or adjusted under 35 U.S.C. 154(b) by 89 days.

(21) Appl. No.: 15/465,232

(22) Filed: Mar. 21, 2017

(65) Prior Publication Data
US 2017/0278880 A1 Sep. 28, 2017

Related U.S. Application Data

(63) Continuation-in-part of application No. 14/926,957, filed on Oct. 29, 2015, now Pat. No. 10,128,283.
(Continued)

(51) Int. Cl.
*H01L 27/142* (2014.01)
*H02J 9/06* (2006.01)
(Continued)

(52) U.S. Cl.
CPC .............. *H01L 27/142* (2013.01); *H02J 7/00* (2013.01); *H02J 7/007* (2013.01); *H02J 7/0068* (2013.01);
(Continued)

(58) Field of Classification Search
CPC ... H01L 27/142; H02J 7/00; H02J 7/35; H02J 7/345; H02J 7/0068; H02J 7/007;
(Continued)

(56) References Cited

U.S. PATENT DOCUMENTS 4,471,418 A * 9/1984 Tuma ................ H02M 3/33507
323/285
5,914,542 A * 6/1999 Weimer .................. H02J 7/345
307/125
(Continued)

*Primary Examiner* — Que Tan Le
*Assistant Examiner* — Jennifer D Bennett
(74) *Attorney, Agent, or Firm* — DeLio Peterson & Curcio LLC; David R. Pegnataro

(57) ABSTRACT

A system and method for measuring energy harvested from at least one energy source for use in an access control system. The method comprises charging a capacitive storage device to a voltage high threshold, where the capacitive storage device is for storing energy harvested from at least one sensor receiving energy from at least one energy source and the capacitive storage device is coupled to an energy harvesting manager adapted for managing the amount of energy received by the at least one sensor, and applying a reference load to the capacitive storage device until the capacitive storage device discharges to a predetermined voltage value, the reference load having a predetermined resistance value. The method further comprises determining a time constant, the time constant defined as the length of time required for the capacitive storage device to discharge to the predetermined voltage value, determining an exact or near exact capacitance of the capacitive storage device by comparing the time constant to the reference load predetermined value, discharging the capacitive storage device to a voltage low threshold, and determining an amount of energy used per charge unloaded of the capacitive storage device by comparing the voltage high threshold and the voltage low threshold.

4 Claims, 9 Drawing Sheets

Related U.S. Application Data

(60) Provisional application No. 62/073,446, filed on Oct. 31, 2014, provisional application No. 62/073,422, filed on Oct. 31, 2014, provisional application No. 62/311,114, filed on Mar. 21, 2016.

(51) Int. Cl.
*H05B 37/02* (2006.01)
*H02J 7/34* (2006.01)
*H02J 7/35* (2006.01)
*H02J 7/00* (2006.01)
*E05B 47/00* (2006.01)

(52) U.S. Cl.
CPC ............... *H02J 7/345* (2013.01); *H02J 7/35* (2013.01); *H02J 9/061* (2013.01); *H05B 37/0218* (2013.01); *E05B 2047/0058* (2013.01); *E05B 2047/0062* (2013.01); *E05B 2047/0064* (2013.01); *Y02B 10/72* (2013.01); *Y02B 20/46* (2013.01)

(58) Field of Classification Search
CPC ..... H02J 9/061; H05B 37/0218; H05B 37/02; H05B 5/0062; E05B 2047/0064; E05B 2047/0062; E05B 2047/0058; B60R 25/24; H01H 2300/03; H01H 2239/076; G01R 31/00; G07C 2009/00579; Y02B 20/46; Y02B 10/72

See application file for complete search history.

(56) References Cited

U.S. PATENT DOCUMENTS

| | | |
|---|---|---|
| 6,457,270 B1 | 10/2002 | Stark, III et al. |
| 7,336,150 B2 | 2/2008 | Gokcebay et al. |
| 7,999,656 B2 | 8/2011 | Fisher |
| 8,354,914 B2 | 1/2013 | Buckingham et al. |
| 8,810,361 B2 | 8/2014 | Thukral et al. |
| 2005/0035772 A1 | 2/2005 | Bauer et al. |
| 2005/0132766 A1 | 6/2005 | Milo |
| 2007/0090921 A1 | 4/2007 | Fisher |
| 2010/0085160 A1 | 4/2010 | Fu |
| 2011/0006896 A1 | 1/2011 | Barnett et al. |
| 2011/0252845 A1 | 10/2011 | Webb et al. |
| 2011/0264293 A1 | 10/2011 | Forrest et al. |
| 2012/0169453 A1 | 7/2012 | Bryla et al. |
| 2012/0304715 A1 | 12/2012 | Gore et al. |
| 2013/0000366 A1 | 1/2013 | Martel et al. |
| 2014/0021866 A1 | 1/2014 | Birru |
| 2014/0117852 A1 | 5/2014 | Zhai et al. |
| 2014/0183947 A1 | 7/2014 | Chandler et al. |
| 2014/0260459 A1 | 9/2014 | Nguyen et al. |
| 2015/0263663 A1 | 9/2015 | Lazo et al. |
| 2016/0100368 A1 | 4/2016 | Sharma et al. |

\* cited by examiner

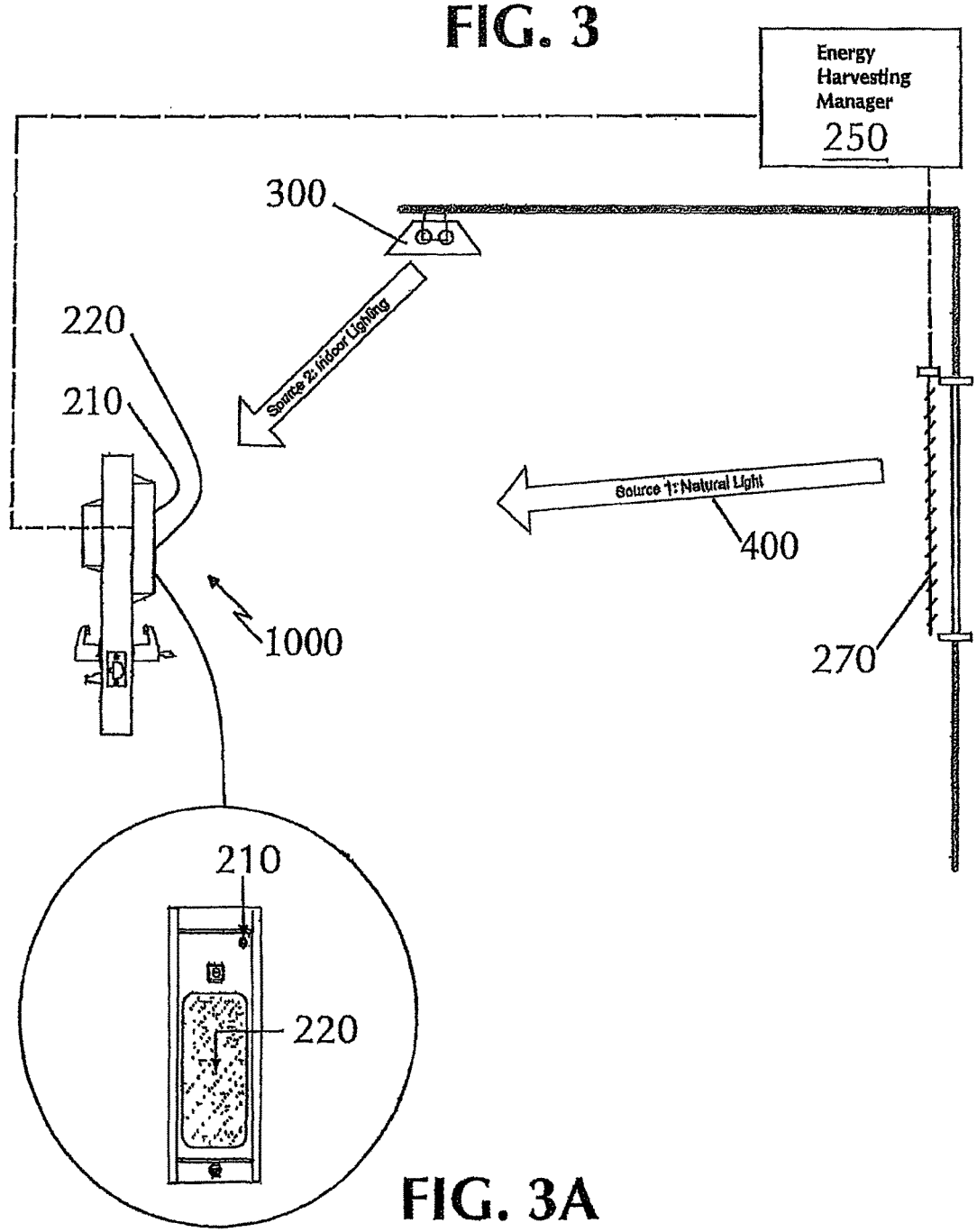

Energy Measurement of Harvested Sources

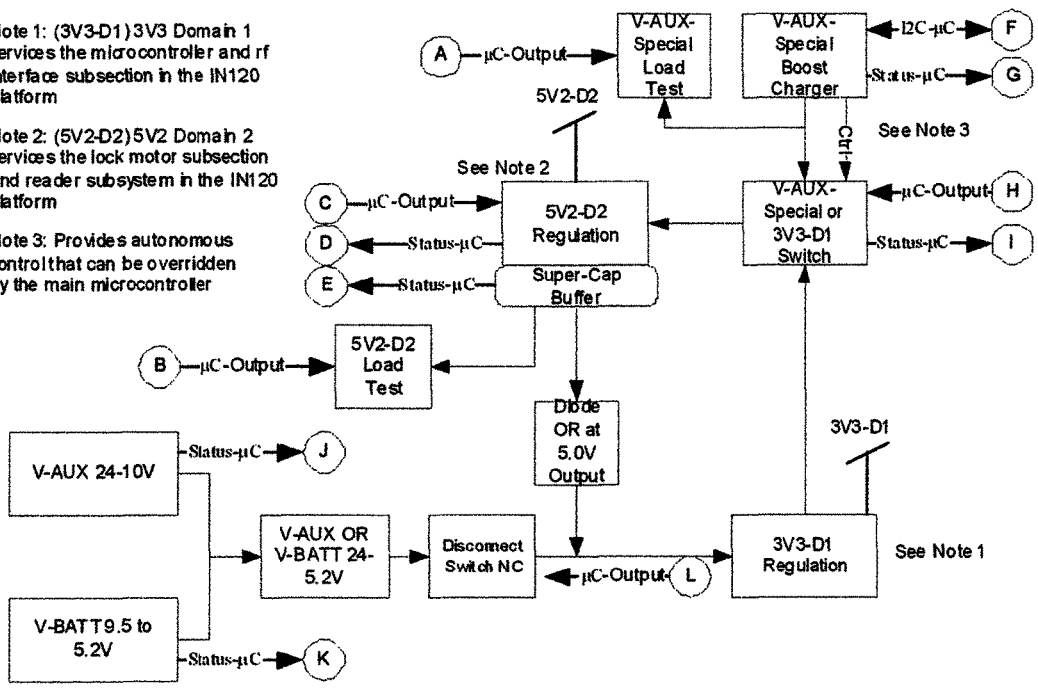

FIG. 7

Processor Interfaces

A. Load Test control for V-AUX Special (Net: HARVESTER_I_REF)

B. Load Test control for 5V2-D2 (Net: PFM_5V_I_REF)

C. Regulator control for 5V2-D2 (Net: CHARGING_EN)

D. Regulator status for 5V2-D2 (Net: CHARGING_EN)

E. Super-Cap Buffer Status (Net: ADC_PFM)

F. I2C Master uC to Slave Peripheral Card (Nets: I2C2_SDA, I2C2_SCL, EXTI2C_INTn_CONN) – Used to communicate with TI bq25505 Boost Charger G. V-AUX-Special status (Net: ADC_SEC_BATT)

H. V-AUX-Special /3V3-D1 Switch control (Nets: SecondaryBattCtrl_Test, PrimaryBattCtrl_Test)

I. V-AUX-Special /3V3-D1 Switch status (Nets: SecondaryBattCtrl_Test, PrimaryBattCtrl_Test)

J. V-AUX 24-10V status (Net: ADC_VAUX) – currently implemented no changes needed K. V-BATT 9.5 to 5.2V status (Net: ADC_BATT) - currently implemented no changes needed L. Disconnect Switch NC (Net: ALT_PWR_OVERRIDE)

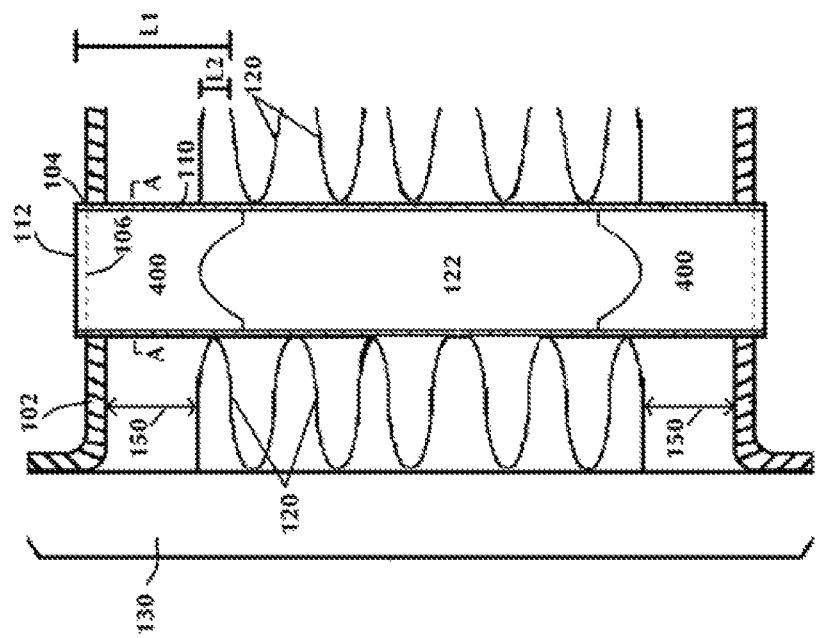
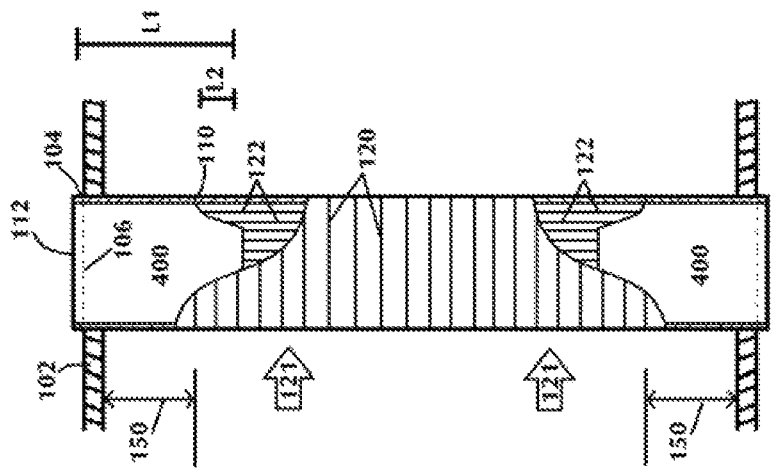
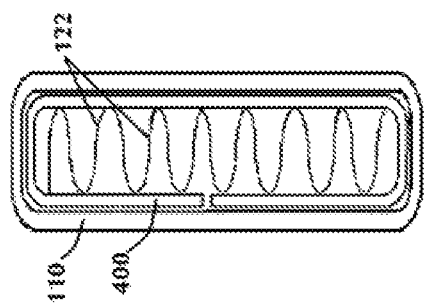
FIG. 11A
FIG. 11B
FIG. 11C

MEASURING HARVESTED ENERGY USING AN ULTRA-LOW DUTY CYCLE MEASUREMENT SYSTEM

RELATED APPLICATIONS

This application is a continuation-in-part of U.S. patent application Ser. No. 14/926,957, filed on Oct. 29, 2015, which claims priority to U.S. Provisional Patent App. No. 62/073,422 filed on Oct. 31, 2014, and U.S. Provisional Patent App. No. 62/073,446 filed on Oct. 31, 2014, the entire disclosures of which are incorporated herein by reference. This application further claims priority to U.S. Provisional Patent App. No. 62/311,114, filed on Mar. 21, 2016.

BACKGROUND OF THE INVENTION

1. Field of the Invention

The present invention relates to access control systems including one or more energy source sensors and energy harvesters, and more specifically, to methods and systems for management and utilization of harvested energy to power access control devices and other system implementation.

2. Description of Related Art

Access control devices or electronic locks need to be powered from an energy source, typically a primary power source such as a chemical battery. As modern electronic devices significantly reduce power consumption, it is becoming plausible to rely on other sources of energy to power such devices, either as a primary power source or as a backup or supplement to another source of energy. One such source is energy harvested from various environmental sources, and these sources of energy can be applied to an access control device using any one or a combination of their effects and can be utilized to provide power for the access control device, or can be used in other system implementation. Sources of energy other than environmental sources, such as electromotive or weak nuclear forces, despite utility for this purpose, are not generally adapted for use in access control systems. Therefore, a need exists for a means to manage and utilize various sources of harvested energy to power such devices and other system implementation.

SUMMARY OF THE INVENTION

Bearing in mind the problems and deficiencies of the prior art, it is therefore an object of the present invention to provide a system which optimizes available energy sources for use in access control systems.

It is another object of the present invention to provide a method for managing harvested energy in an access control system by monitoring available energy sources using one or more sensors to determine the amount of available energy.

A further object of the invention is to provide an improved method of managing power supply circuits in an access control system using harvested energy.

It is yet another object of the present invention to provide an improved system for harvesting energy from available energy sources for use in access control systems.

It is still yet another object of the present invention to provide an improved system and method for measuring the amount of energy harvested in a capacitive storage device from available energy sources.

Still other objects and advantages of the invention will in part be obvious and will in part be apparent from the specification.

The above and other objects, which will be apparent to those skilled in the art, are achieved in the present invention which is directed to a system for managing light energy in an access control system, comprising an access control device positioned in an area of a building that will provide at least one light source, and at least one light sensor positioned on a surface of the access control device and receiving light energy from the at least one light source. An energy harvesting manager is coupled to the at least one light sensor, wherein the energy harvesting manager manages the amount of light energy received by the at least one light sensor. The system further comprises an interconnect between the energy harvesting manager and the access control device, and the interconnect may comprise electrical, inductive, or optical connectivity.

The energy harvesting manager may measure the amount of light energy received from the at least one light source and determine whether the measured amount of light energy is above a predetermined threshold. The system may further include at least one energy harvester, and if the measured amount of light energy is above the predetermined threshold, the energy harvesting manager may instruct the at least one energy harvester to convert the light energy into harvested energy. If the measured amount of light energy is not above the predetermined threshold, the energy harvesting manager may transmit a signal to another component in the access control system to adjust the amount of light energy available to the at least one light sensor from the at least one light source until the predetermined threshold is reached. The at least one energy harvester may be a photovoltaic cell fitted to the access control device for absorbing light energy received from the at least one light source and converting the light energy into harvested energy.

The energy harvesting manager may determine that a power level of the harvested energy is above a predetermined threshold, and the energy harvesting manager may power the access control device using the harvested energy.

The system may further comprise a secondary energy storage, and the energy harvesting manager may determine that a power level of the harvested energy is above a predetermined threshold and charge the secondary energy storage using the harvested energy. The secondary energy storage may comprise at least one of a rechargeable battery and a capacitor.

The energy harvesting manager may transmit the amount of light energy received by the at least one light sensor to another of a plurality of components in the access control system for use in management of one or more power supply circuits.

In another aspect, the present invention is directed to a method for managing light energy received from at least one light source by at least one light sensor in an access control system. The method comprises receiving light energy by the at least one light sensor, measuring the amount of light energy received by an energy harvesting manager interconnected with an access control device, and determining whether the measured amount of light energy is above a predetermined threshold. If the measured amount of light energy is above the predetermined threshold, the method comprises the light energy into harvested energy by at least one energy harvester. If the measured amount of light energy is not above the predetermined threshold, the method comprises adjusting the amount of light energy available to the at least one light sensor from the at least one light source until the predetermined threshold is reached. The amount of light energy available to the at least one light sensor may be adjusted by opening or closing a window blind or shade to vary the amount of light entering an area in which the at least one light sensor is located. The at least one energy harvester may be a photovoltaic cell or cells fitted to the access control device for absorbing light energy received from the at least one light source.

The method may further comprise determining that a power level of the harvested energy is above a predetermined threshold, and powering the access control device using the harvested energy. The method may further comprise monitoring a power level of a primary power source interconnected to the access control device, determining that the power level of the primary power source has fallen below a critical threshold, and combining the harvested energy with energy drawn from the primary power source to power the access control device.

The method may further comprise determining that a power level of the harvested energy is above a predetermined threshold, and charging an energy storage interconnected to the access control device using the harvested energy, wherein the energy storage is separate from a primary power source used to power the access control device. In another embodiment, the method may comprise monitoring a power level of a secondary power storage, determining whether the power level of the secondary power storage is above a predetermined threshold, and if the power level of the secondary power storage is not above the predetermined threshold, sending a signal by the energy harvesting manager to another component in an access control system to adjust the amount of light energy available to the at least one light sensor from the at least one light source until the predetermined threshold is reached, before converting the light energy into harvested energy by the at least one energy harvester and charging the secondary power storage using the harvested energy.

The method may further comprise, subsequent to measuring the amount of light energy received by an energy harvesting manager interconnected to the access control device, transmitting by the energy harvesting manager the measured amount of light energy received to another of a plurality of components in the access control system for use in management of one or more building power supply circuits.

In yet another aspect, the present invention is directed to a method for managing energy potential received from at least one energy source by at least one sensor interconnected with an access control device. The method comprises receiving energy potential by the at least one sensor, measuring the amount of energy potential received by an energy harvesting manager interconnected with the at least one sensor and the access control device, and determining whether the measured amount of energy potential is above a predetermined threshold. If the measured amount of energy potential is above the predetermined threshold, the method comprises converting the energy potential into harvested energy by at least one energy harvester. If the measured amount of energy potential is not above the predetermined threshold, the method comprises adjusting the amount of energy potential available to the at least one sensor from the one or more energy sources until the predetermined threshold is reached.

The at least one energy source may comprise electromagnetic induction, electrolytic-metallic contact, metallic contact, semiconductor contact, triboelectric contact or weak nuclear force, and the method may further comprise the steps of determining that a power level of the harvested energy is above a predetermined threshold, and powering the access control device using the harvested energy.

In still yet another aspect, the present invention is directed to a method for measuring energy harvested from at least one energy source for use in an access control system, comprising providing an access control device adapted to be at least partially powered by energy harvested from at least one energy source; providing at least one sensor receiving energy from the at least one energy source; providing an energy harvesting manager coupled to the at least one sensor, wherein the energy harvesting manager manages the amount of energy received by the at least one sensor; providing a capacitive storage device coupled to the energy harvesting manager, the capacitive storage device for storing energy harvested from the at least one sensor; charging the capacitive storage device to a voltage high threshold, V-HTH; applying a reference load to the capacitive storage device until the capacitive storage device discharges to a predetermined voltage value, Vo/e, the reference load having a predetermined resistance value; determining a time constant, the time constant defined as the length of time required for the capacitive storage device to discharge to the predetermined voltage value, Vo/e; and determining an exact or near exact capacitance of the capacitive storage device by comparing the time constant to the reference load predetermined value, by the expression: $C=RC/RL$, where $C$=capacitance (in farads), $RC$=time constant (in seconds), and $RL$=reference load resistance (in ohms).

The method may further comprise discharging the capacitive storage device to a voltage low threshold, V-LTH; and determining an amount of energy used per charge unloaded, CnL, of the capacitive storage device by comparing the voltage high threshold, V-HTH, and the voltage low threshold, V-LTH, by the expression: $CnL=(0.5*C*(V\text{-}LTH2-V\text{-}HTH2))/3600$, where $CnL$=energy (in watt hours), $C$=capacitance (in farads), V-LTH=voltage low threshold (in volts), and V-HTH=voltage high threshold (in volts).

In another embodiment, the method may further comprise the steps of: calculating a charge time, CtnL, without applying the reference load, defined as the time required to charge the capacitive storage device to the voltage high threshold, V-HTH; charging the capacitive storage device using at least one pulse of current having a duration of between about 150 milliseconds and 500 milliseconds and determining the total charge time, CCt; estimating the amount of energy used per pulse capacitor charge, PCC, by the expression: $PCC=(CCt/CtnL)*CnL$, where $PCC$=energy (in Wh), $CCt$=total charge time (in seconds), $CtnL$=charge time no load (in seconds), and $CnL$=charge no load (in watt hours); and plotting the PCC on an exponential correlation curve to charge time.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 3 is an exemplary access control device including one or more light sensors positioned in an area that will provide one or both of artificial and natural light sources.

FIG. 3A is a plan view of the access control device of FIG. 3, showing a light sensor in conjunction with a photovoltaic cell.

FIG. 7 is a block diagram of an exemplary energy harvesting circuit of the present invention.

DESCRIPTION OF THE EMBODIMENT(S)

Figure 1:
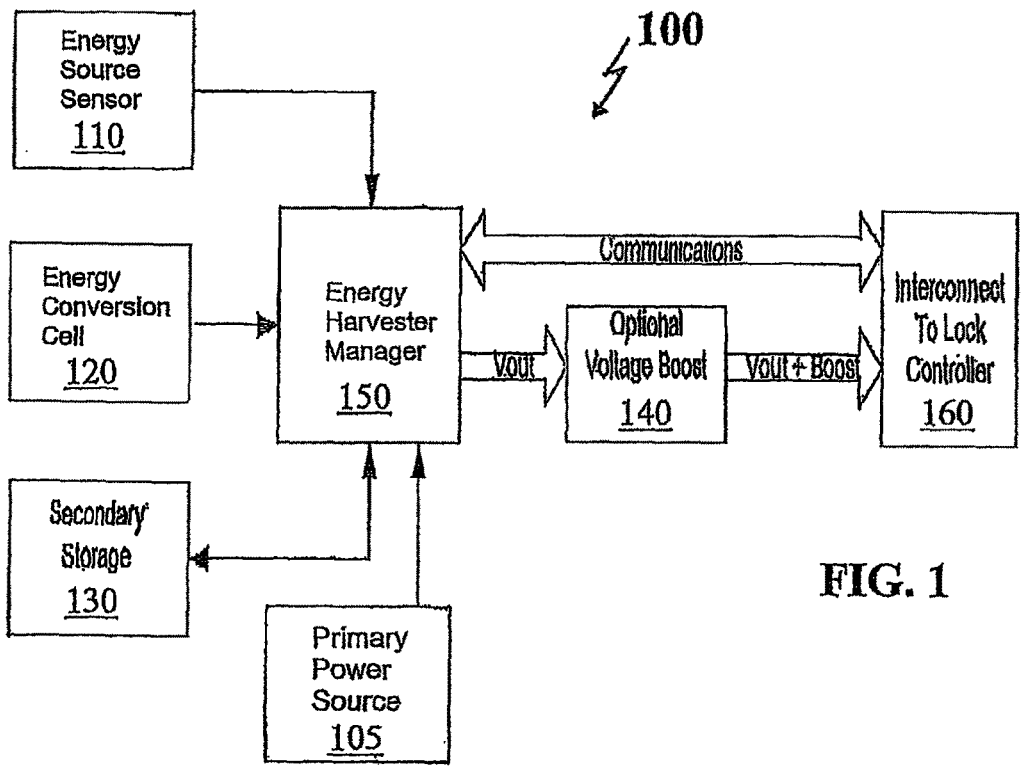
FIG. 1 is a block diagram showing an exemplary system for managing and utilizing harvested energy in an access control system, according to various embodiments of the present invention.

In describing the embodiments of the present invention, reference will be made herein to FIGS. 1-11 of the drawings in which like numerals refer to like features of the invention.

Certain terminology is used herein for convenience only and is not to be taken as a limitation of the invention. For example, words such as "upper," "lower," "left," "right," "horizontal," "vertical," "upward," and "downward" merely describe the configuration shown in the drawings. For purposes of clarity, the same reference numbers may be used in the drawings to identify similar elements.

Additionally, in the subject description, the word "exemplary" is used to mean serving as an example, instance or illustration. Any aspect or design described herein as "exemplary" is not necessarily intended to be construed as preferred or advantageous over other aspects or design. Rather, the use of the word "exemplary" is merely intended to present concepts in a concrete fashion.

The present invention is directed to systems and methods for managing and utilizing harvested energy to power access control devices and/or for other access control system implementation. Access control devices need to be powered from an energy source, typically a primary power source such as a chemical battery. As modern electronic devices significantly reduce power consumption, it is becoming plausible to rely on other sources to power such devices, either as a primary power source or as a backup or supplement to another source of energy. The types of energy available and usable for this purpose include energy harvested from the environment, such as light energy, as well as non-environmental sources such as electromotive forces or potentially weak nuclear forces. These sources of energy can be applied to an access control device using any one or a combination of their effects and can be utilized to provide power for the access control device, or can be used in other system implementation.

Aspects of the present teachings relate to an access control system including one or more energy source sensors and energy harvesting elements that can harvest energy from various identified sources to power an access control device or electronic lock, or for other system implementation. The energy harvesting elements are interconnected to a controller or energy harvesting manager which manages all energy harvesting peripherals and may use the harvested energy for system implementation including, for example, to supply or supplement the energy necessary to power an access control device. Environmental sources can include ambient or background sources of energy, examples of which include electromagnetic radiation (e.g., visible light, infrared light, radio waves, etc.), magnetic field, radiation, vibration, mechanical and biomechanical movement, heat, chemical reaction, pressure, airflow, and the like.

Referring now to FIG. 1, a block diagram of an exemplary access control system of the present invention is shown. The system 100 may generally comprise an energy harvester or energy conversion cell or device 120, an energy harvesting manager 150, and an interconnection 160 to a controller for a lock or access control device (not shown), such as a door opener or closer. Energy harvesting manager 150 manages all energy harvesting peripherals and is capable of outputting constant energy to the lock controller. Energy harvesting manager 150 can receive and manage energy absorbed or harvested by energy conversion cell 120 from one or more identified energy sources, as described in further detail below, and can use the harvested energy to power and/or control the access control device, or for other system implementation. Energy harvesting manager 150 can manage energy harvested by energy conversion cell 120 by, for example, monitoring the availability of harvested energy, conditioning the harvested energy, combining the harvested energy with energy from another source, communicating with the lock controller, and the like. Energy harvesting manager 150 can condition the harvested energy, for example, by rectifying, smoothing, stepping up, and/or stepping down the voltage of the harvested energy. In one or more embodiments, the system 100 may include a voltage boost 140 that is optimized for interfacing with the connected lock controller or access control device.

Energy harvesting manager 150 may include a voltage converter, a regulating circuit, rectifiers and matching networks, a power conditioner, a power switch/combiner, and/or any other hardware or software configured to provide power continuously, periodically, or on-demand. Energy harvesting manager 150 may be interconnected to a secondary energy storage 130 and can store the harvested energy in energy storage 130, or can draw energy from energy storage 130 to supplement or provide the energy needed to power the access control device. Energy harvesting manager 150 can control the continuous, periodic, or sporadic charging or discharging of energy storage 130. Secondary energy storage 130 may be a rechargeable battery, a capacitor, a combination of a battery and a capacitor, or may be any other rechargeable energy storage known to one skilled in the art. Energy harvesting manager 150 can divert and regulate the voltage and/or amperage of the harvested energy to charge energy storage 130, and can draw power from energy storage 130 as needed to power the access control device.

FIG. 7 depicts a block diagram of an exemplary energy harvesting circuit of another embodiment of the present invention. As shown in FIG. 7, the system may comprise two primary power sources and one secondary power source. The primary sources may be defined as V-AUX and V-BATT. V-AUX may be designed to operate from a voltage source of 9.5-24V and may be a low leakage source input which can be sourced with primary battery power, secondary battery power, or hardwired operation. V-BATT may be designed to operate from a voltage source of 5.2-9.5V and may be a low leakage source input which is designed to be primarily used with alkaline batteries.

The primary sources, V-AUX and V-BATT, may be diode OR'd together with diodes that are designed to prevent reverse leakage of no more than 1 uA. The resulting diode OR'd output to 3V3-D1 can be switched to either open or closed. The switch should be opened only if there is sufficient energy harvested and stored in V-AUX-Special to supply the entire system. This scenario will occur if the V-AUX-Special is in a surplus state where it is producing more energy than can be used from the 5V2-D2 rail alone.

The secondary source may be defined as V-AUX-Special. V-AUX-Special may be designed to operate from a voltage source of 2.75-5.2V. V-AUX-Special or 3V3-D1 can be used to source power to 5V2-D2 with a switch determining the selected source. In some embodiments, the 3V3-D1 is used to source power to 5V2-D2. In other embodiments, V-AUX-Special may be used to source power to 5V2-D2 only if there is sufficient harvested energy available.

Status indication of switch state is provided to an interrupt via Harvest_Ctrl net. Additionally, forced options are available for short term testing via Harvest_Ctrl and 3V3_Ctrl nets.

The 5V2-D2 regulation may use a hysteric power supply, which boosts an input of from 2.75-5.2V to about 5.135-5.35V. The boost regulation occurs in short pulses of about 100 mA with durations from 150 ms to about 500 ms or more. These short pulses charge two balanced super-capacitors arranged in series. The super-capacitors store the energy with a 2-3 uA leakage for about 1 hour when the system is in a quiescent state. The stored energy in the capacitor may be designed to be utilized for short high current pulse requirements to drive motors and RF devices. The supply is designed to supply current of up to 1 A at 5.2V for durations of 150 ms and 150 mA with no duration limit, as shown in the chart at FIG. 10.

The 5V2-D2 may be used to power an access control device. The 5V2-D2 may also be diode OR'd into the 3V3-D1 regulation input and can be used to supply the entire system during an energy harvest switch over or to supply energy for power fail operation. The 5V2-D2 regulation can be forced to an off state for testing purposes. The 5V2-D2 regulation enable pin is defaulted to on, but is controlled by the hysteric comparator. The status of the enable pin is connected to an interrupt input and is intended to be used for energy monitoring.

The V-AUX-Special and 5V2-D2 with super-capacitor buffer have features to check their voltage levels and both have reference test loads to verify their storage capacity.

In accordance with the present invention, measuring harvested energy cannot be fully measured by only measuring utilized energy. This is because it is possible to produce or harvest more energy than the system utilizes. The total energy harvested may be measured and reconciled only if there is sufficient storage to store excess energy. If there is insufficient storage for excess energy, then the system will dispose of unwanted energy. It is noted that in various embodiments of the invention, if there is more energy than needed for one power source, then the excess energy may be used to power a second power source. If there is still more energy than can be utilized, it will be removed from the system and not counted.

In one or more embodiments, the secondary energy storage of the present invention may be a capacitive storage device, such as a super capacitor, lithium-capacitor or other similar device. To measure harvested energy in capacitive storage devices, it is first necessary, for calibration purposes, to determine the size of the energy capacitance, as capacitance components are defined as having a specific range of capacitance plus or minus a percentage of the nominal capacitance. Capacitance refers to the ability of a capacitor to store charge, and is the measurement used to indicate how much energy a particular capacitor can store. The calibration concept is based on the time required to charge the capacitor under a known load and the time it takes to discharge the capacitor under a known load.

Figure 8:
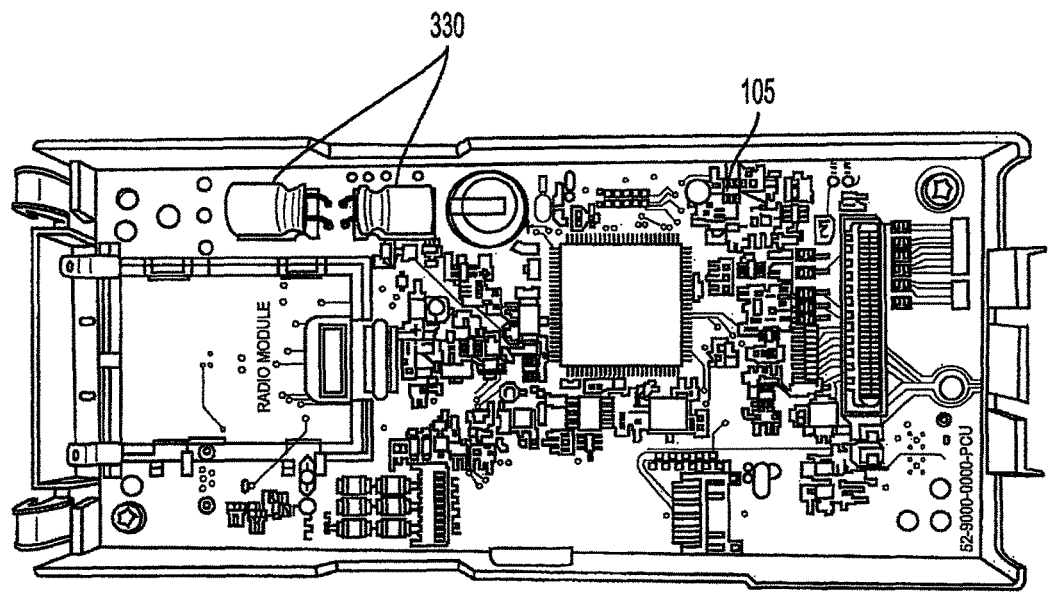
FIGS. 8 and 9 are top plan views of exemplary energy harvesting circuitry of the present invention.
Figure 9:
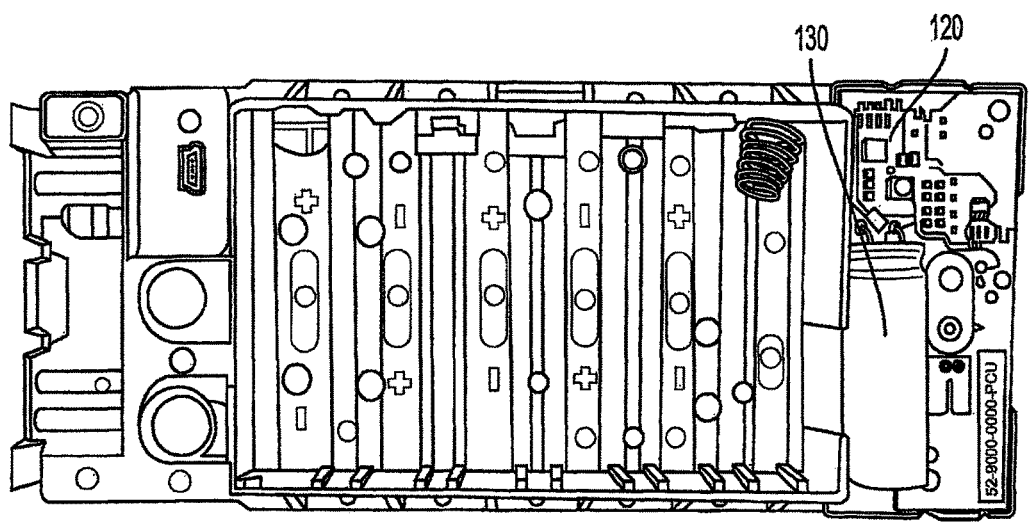
Figure 10:
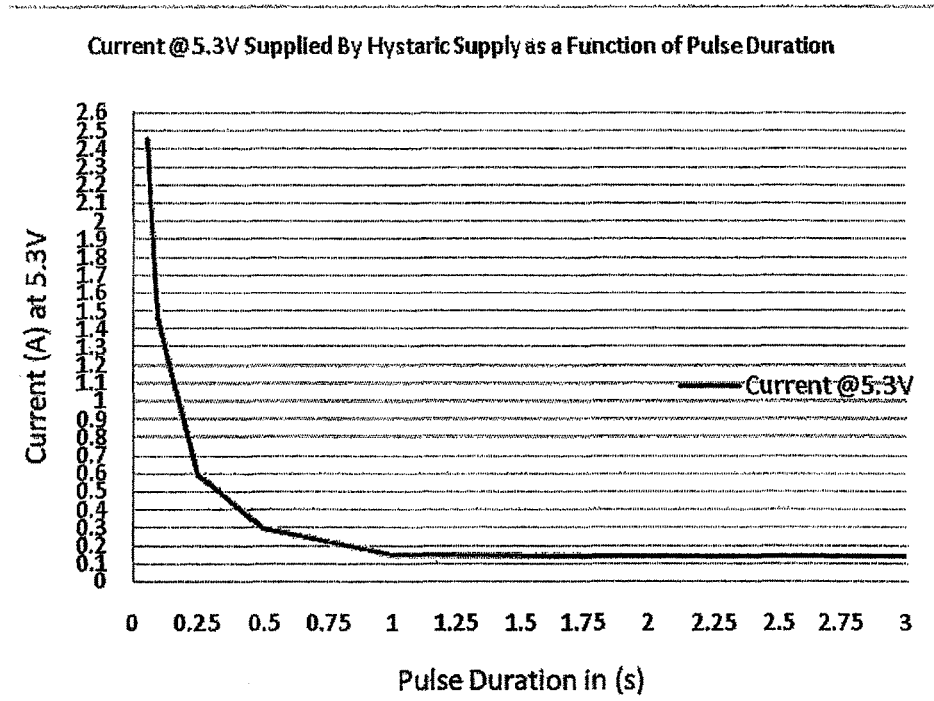
FIG. 10 is a chart depicting current supplied by the power supply as a function of pulse duration.

In accordance with the present invention, to measure the exact or near exact capacitance of the capacitive storage device, a reference load 350 is applied to the capacitance and the rate of change in the voltage over time is defined. As shown in FIGS. 7 and 8, such reference loads for the method may be defined as 'V-AUX Special Load Test' and '5V2-D2 Load Test', and may be on the order of 1000 Ohms. It should be understood by those skilled in the art that a 1000 Ohms test load is described for exemplary purposes only, and that the present invention is not intended to be limited to such values. It is proposed that because of small changes in voltage over time for some reference loads, that a statistical method using linear regression be used to ensure the best quality of the measurements.

Figure 11:
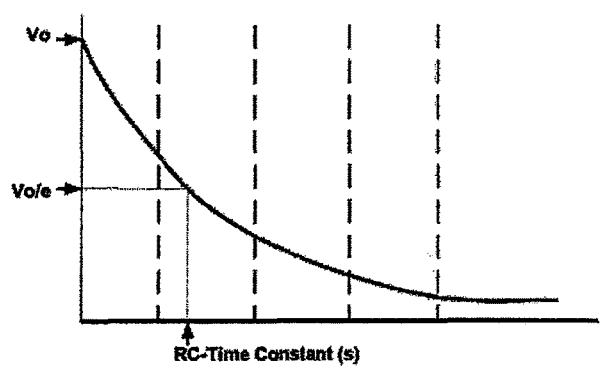
FIG. 11 is a chart depicting an exemplary voltage discharge of a capacitor from an established voltage high threshold.

In accordance with a method of the present invention, determination of the exact or near exact capacitance of the capacitor should occur immediately after the capacitive storage device has been charged. The initial voltage $V_o$ or 'V-HTH' (voltage high threshold) is recorded as the voltage discharge starting point. Once the initial voltage $V_o$ or V-HTH is established, the 'V-AUX Special Load Test' or '5V2-D2 Load Test' reference load 350, such as 1000 Ohms, is applied until the voltage of the capacitor discharges to a value equal to $V_o/e$ or $1/e$ of its initial value. The amount of time to reach $V_o/e$ is equal to the Time Constant (RC). The point at which the capacitor is fully discharged is known as the 'V-LTH' (voltage low threshold). An exemplary graph depicting the voltage discharge is shown at FIG. 11.

To calculate the size of the capacitor, the time constant is divided by the load resistance of the reference load 350, shown by the expression: C=RC/LR, where C is the capacitor size, RC is the time constant and LR is the reference load resistance.

Once an exact or near exact measurement of the capacitive storage is defined, the amount of energy that is used in the system in real-time may be determined by measuring quantized energy charging. This may be accomplished by measuring the charge time for a 'Super-Cap Buffer,' as shown in FIG. 7. FIG. 8 depicts an exemplary circuitry of the present invention including a 'Super-Cap Buffer' 330. The energy used per charge unloaded is defined as $J=0.5 \times C \times (V\text{-}LTH^2 - V\text{-}HTH^2)$, where J is the energy used per charge in joules. To convert to Wh (watt hour), J is divided by 3600, to reach the CnL or 'Charge no Load' value in Wh.

The time it takes to charge the capacitor is then measured. To charge without a load, it is necessary to first apply the reference load until the V-LTH is met. The total charge time (in seconds) is defined as the CtnL or 'Charge time no Load'. The CnL and CtnL values may be used to estimate the total energy used in the system, including if there is a load or not. To calculate the total energy used, the measured 'Capacitor Charge Time' or CCt each time a charge occurs is divided by the CtnL and multiplying the result by the CnL to determine the 'Pulse Capacitor Charge' or PCC, where PCC=(CCt/CtnL)×CnL.

The system-utilized energy or the energy used to charge the 'Super-Cap Buffer' 330 (i.e. 'Pulse Capacitor Charge' or PCC) has been shown in practice to be an exponential correlation curve to charge time. This implies that as charge time increases, then energy added to the system increases at an exponential rate, where the rate of increase per unit time is imperially defined. Each time the charge occurs, it is assigned a value of energy and added to a running count in one of two registers, one for the battery (V-AUX) and the other for the secondary storage 130 or 'V-AUX SPECIAL' (FIG. 7). Energy that had not been utilized from the 'V-AUX Special Boost Charger' or the energy harvesting secondary source 130 is then reconciled using a delta voltage per delta time measurement, minus the energy that had been utilized and counted. This measurement can occur daily or weekly.

One major source of energy waste is idle listening, which is a dominant factor in sensor network applications such as that of the present invention. A known approach to reducing energy lost to idle listening is to lower the radio duty cycle by turning the radio off part of the time. Duty cycle may be defined as the ratio between listen time and a full listen/sleep interval. To keep the abstraction of a fully connected network, many networks use duty cycling. Three approaches are generally used: time division multiple access (TDMA), scheduled contention, or low-power listening. Further, scheduling reduces energy cost by ensuring that listeners and transmitters have a regular, short period in which to rendezvous and can sleep at other times.

The benefit to the system of the present invention is that the energy measurement only occurs during a 'Super-Cap Buffer' 330 charge, thus the processor time can be limited to a few milliseconds per day or less. Thus, the energy burden of doing energy measurement may be in the nano ampere (nA) range for the subsystem and applicable to ultra-low duty cycle power requirements.

Energy harvesting manager 150 can also manage harvested energy by switching between the harvested energy and energy from another source to power the access control device, such as a primary power source 105, e.g. a chemical battery or mains power, based on the availability of the harvested energy and power demands of the access control device. For example, energy harvesting manager 150 can switch to harvested energy and rely on the harvested energy to power the access control device when energy harvesting manager 150 determines that a power level of the harvested energy, which may be stored in secondary energy storage 130, is above a threshold. Energy harvesting manager 150 can determine the power level based on the harvested energy's potential (e.g., voltage), flow rate (e.g., amperage), and/or power (e.g., wattage). For another example, energy harvesting manager 150 can switch to a non-harvested source of power, such as chemical batteries or mains power 105, to power the access control device when energy harvesting manager 150 determines that the power level of harvested energy falls below a threshold.

According to various embodiments, the system of the present invention is capable of absorbing energy from a variety of identified energy sources, including environmental sources, such as visible light, electromotive sources or weak nuclear forces, and converting the absorbed energy into another form of energy, for example, electromagnetic radiation to electricity, mechanical (e.g., vibration, pressure, motion, etc.) to electricity, heat to electricity, magnetic field to electricity, chemical reaction to electricity, and the like.

Examples of electromotive forces available and usable to power the access control device include electromagnetic induction, electrolytic-metallic contact, metallic contact, semiconductor contact, or triboelectric contact, as described in more detail below. Alternatively, a weak nuclear force, e.g. radioactive decay, can result in spontaneous heat creation which can create power which can be converted into a useable potential to produce a charge to directly source a power supply or charge a secondary power storage in an access control system.

In one or more embodiments of the access control system of the present invention, electromagnetic induction may be utilized to either transfer power to the access control device directly through a conductor or through coupling. An electrical generator, such as a dynamo, may be used to produce a direct current flow that connects directly to the access control device. The mechanical force used to drive the dynamo may be linear or angular momentum, and the power may be converted into a useable potential by energy conversion cell 120 and utilized by energy harvesting manager 150 to produce a charge in secondary power storage supply 130 or to directly source a power supply, e.g. to power the lock or access control device directly. Energy harvesting manager 150 may further communicate with the lock controller or access control device and the interconnection 160 between the energy harvesting manager and the lock controller may be electrical, inductive, optical, or any other method known to one skilled in the art. The access control system may further include an energy source sensor 110 interconnected with energy harvesting manager 150 for higher level management of the energy source and its utility.

In another embodiment, inductive coupling transformers may be used to induce direct transfer of energy between two or more circuits through electromagnetic induction. A varying current in the transformer's primary winding creates a varying magnetic flux in the core and a varying magnetic field impinging on the secondary winding. The varying magnetic field at the secondary winding induces a varying electromotive force (emf) in the secondary winding, and the power may be converted into a useable potential by energy conversion cell 120 and utilized by energy harvesting manager 150 to similarly produce a charge in secondary power storage supply 130 or to directly source a power supply for the lock or access control device.

In still another embodiment, the system may be capable of sensing a wireless energy transfer, such as through near-field or far-field RF. Near-field RF may be a reactive near field and/or radiative near field. In reactive near field, either E or H fields dominate; whereas in radiative near-field, there are no reactive field components. The near-field radiative or reactive power can be transmitted or absorbed up to a range of two times the wavelength. The transmitted power may be converted into a useable potential by energy conversion cell 120 and utilized by energy harvesting manager 150 to produce a charge in secondary power storage supply 130 or to directly source a power supply. In far-field RF, radiation decreases as the square of distance and absorption of the radiation does not feed back to the transmitter. The far field RF is dominated by E and B fields. Energy can be transmitted over distances that are two times the wavelengths. The radiated power may be converted into a useable potential by energy conversion cell 120 and utilized by energy harvesting manager 150 to similarly produce a charge in secondary power storage supply 130 or to directly source a power supply for the lock or access control device.

In other embodiments of the present invention, a device for inducing electrolytic-metallic or metallic contact may be coupled to the access control system to provide a power source. Electrolytic-metallic contact from chemical sources, such as batteries or fuel cells, may be used to power the access control device as a time-released power source or power storage device. Batteries, through redox reactions, may be used as a primary power source, and may be in cell form and common types such as Alkaline, Lithium Ion, and Nickel Metal Hydride. Alternatively, fuel cells may be a primary power source that over timed releases may be used to produce a charge in secondary power storage supply 130 or to directly source a power supply. In one or more embodiments, a device inducing metallic contact coupled to the access control system may be utilized to release or transduce a potential from a metallic to metallic contact, such as in thermoelectric/pyroelectric contact resulting in the Seebeck effect, e.g. conversion of temperature differences directly into electricity. In an embodiment of the present invention, a thermoelectric device creates voltage when there is a temperature gradient between metallic to metallic contacts, and this conversion of heat to electricity can be used as a power source. The power may be converted into a useable potential by energy conversion cell 120 and utilized by energy harvesting manager 150 to produce a charge in secondary power storage 130 or to directly source a power supply for the lock or access control device.

In still other embodiments of the present invention, a device for inducing triboelectric contact may be coupled to the access control system to provide a power source. Generally, if two different insulators are placed together or rubbed together, one of the two insulators will acquire a negative charge and the other will acquire an equal positive charge. When the two insulators are pulled apart, a potential is produced. This potential can be used to generate power, which may be converted into a useable potential by energy conversion cell 120 and utilized by energy harvesting manager 150 to similarly produce a charge in secondary power storage 130 or to directly source a power supply for the lock or access control device.

In still yet other embodiments of the present invention, the system may utilize semiconductor contact, e.g. a metallic contact with a semiconductor material, or two different semiconductors that are placed in contact, to provide a power source. Generally, when a metal contacts a semiconductor material or when two semiconductors are placed in contact, one material becomes slightly positively-charged and the other slightly negatively-charged. In materials, for example, with a direct band gap, if a bright light is aimed at one part of the contact area between the two semiconductors, the voltage at that spot rises and electric current will appear. One such example is the piezoelectric effect, e.g. mechanical stress or pressure, wherein an electrical charge accumulates in certain solid materials in response to applied mechanical stress. The power can be converted into a useable potential by energy conversion cell 120 and utilized by energy harvesting manager 150 to produce a charge in secondary power storage 130 or to directly source a power supply for the lock or access control device.

Another such example of semiconductor contact is the photovoltaic effect. In various embodiments of the present invention, the access control system may utilize solar cells or photovoltaic cells to convert and/or harvest light energy into useable potential. Solar cells are, in general, a semiconductor to semiconductor contact with a direct band gap between the materials that is optimized to cause flow between the materials when solar or sun light spectrums are aimed at the point of contact. At this point of contact, light energy is converted into electrical energy. Photovoltaic cells use the same principals as solar cells, but the spectrums are optimized from shorter spans. The light energy power can be converted into a useable potential by energy conversion cell 120 and utilized by energy harvesting manager 150 to produce a charge in secondary power storage 130 or to directly source a power supply for the lock or access control device.

The system of the present invention may include one or more harvesters capable of harvesting energy from one source or multiple harvesters capable of harvesting energy from one or more sources. For example, the system may include a photovoltaic cell, an array of photovoltaic cells, a photovoltaic cell and a piezoelectric transducer, an array of photovoltaic cells and a piezoelectric transducer, and the like. In configurations where the system includes multiple harvesters, energy harvesting manager 150 can monitor the availability of energy being harvested by each harvester, condition the energy being harvested by each harvester, switch between or combine the energy being harvested by each harvester to the power access control device, and the like. Furthermore, in configurations where the system includes multiple types of harvesters each capable of harvesting energy from a different environmental source, energy harvesting manager 150 can monitor the availability of energy being harvested by each type of harvester, condition the energy being harvested by each type of harvester, switch between or combine the energy being harvested by each type of harvester to the power access control device, and the like.

Figure 2:
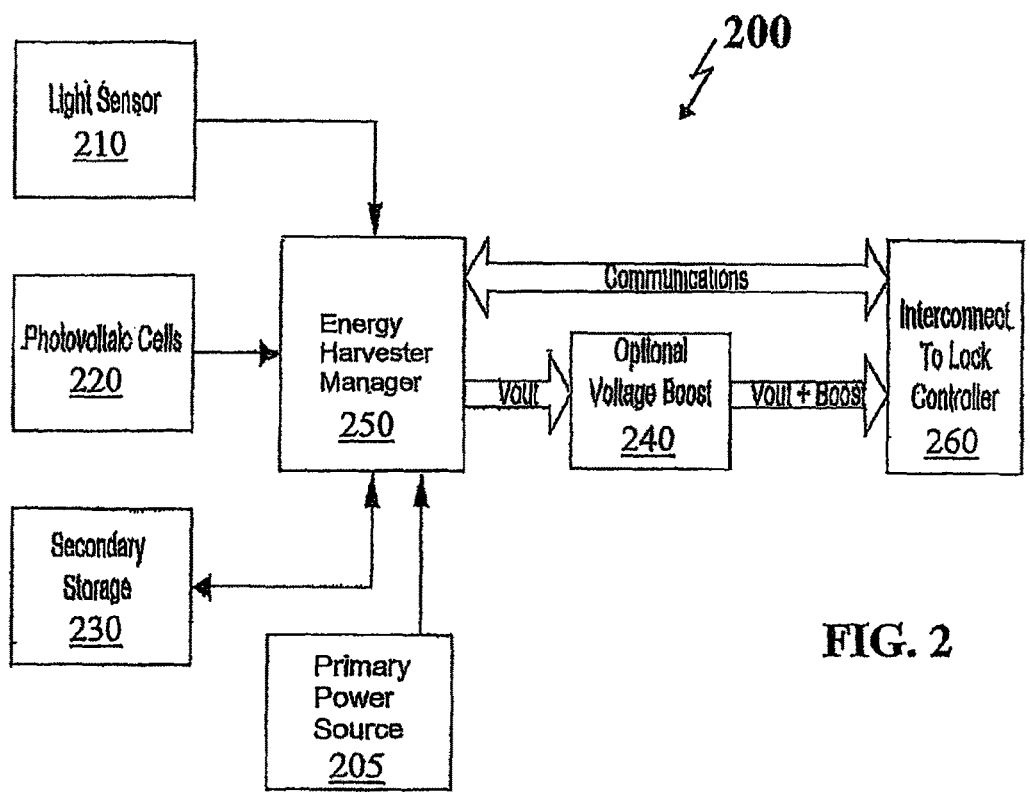
FIG. 2 is a block diagram showing a system for managing and utilizing harvested light energy in an access control system, according to an embodiment of the present invention.
Figure 4A:
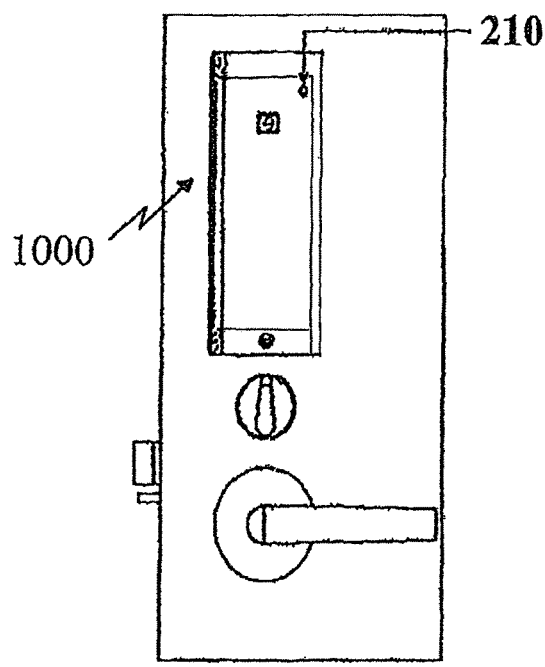
FIGS. 4A and 4B are exemplary embodiments of a door with an access control device including one or more light sensors positioned on the interior (FIG. 4A) and exterior (FIG. 4B) surfaces, respectively, of the door.
Figure 4B:
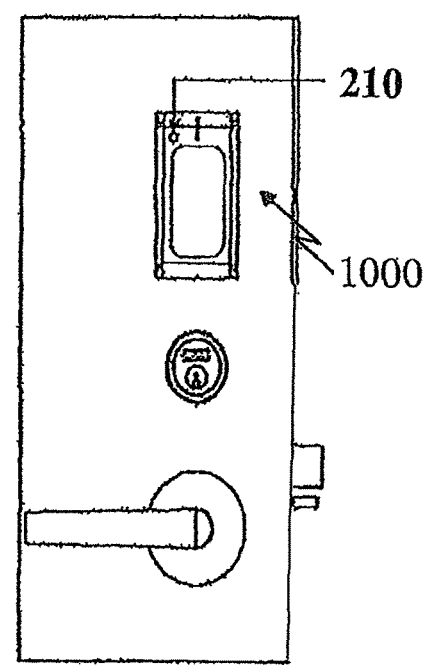

FIG. 2 depicts in block diagram an exemplary access control system of the present invention which utilizes harvested photovoltaic energy. The system 200 is substantially identical to that described above for managing and utilizing energy harvested from electromotive or weak nuclear forces, and may comprise a light sensor or sensors 210, a photovoltaic cell or cells 220, a secondary storage device 230, an energy harvesting manager 250, a primary power source 205, e.g. conventional building AC or DC power or a battery, and an interconnection 260 to a controller for a lock or access control device, such as a door opener or closer (not shown). The photovoltaic cell or cells 220 may be connected to the energy harvesting manager, and are used to absorb light energy from one or more identified light energy sources, as described in further detail below.

The energy harvesting manager 250 manages all energy harvesting peripherals and is capable of outputting constant energy to the lock controller or access control device. Energy harvesting manager 250 can receive and manage energy absorbed or harvested by photovoltaic cell or cells 220 from one or more identified light energy sources, and use the harvested energy to power and/or control the access control device, or for other system implementation, as described in further detail below. Energy harvesting manager 250 can condition the harvested light energy, for example, by rectifying, smoothing, stepping up, and/or stepping down the voltage of the harvested energy. In one or more embodiments, the system 200 may include a voltage boost 240 that is optimized for interfacing with the connected lock controller or access control device.

Referring now to FIG. 3, an access control device or electrically controlled lock 1000 is fitted with a light sensor 210 and placed in a room or other area of a building that will provide at least one identified light source 300, 400. As shown in FIG. 3, the light source may be an artificial light source, such as overhead lighting 300, or a natural light source, such as solar or sunlight 400, or both. The amount of natural light may be controlled by, for example, adjusting the position of blinds or window shade 270 which determine the amount of light 400 that reaches the light sensor 210 and optional photovoltaic cell or cells 220 (FIG. 3A). The light source's intensity, angle of incidence, spectrum and duration may be variable, and the light sources may be inside or outside of the visible spectrum. In an embodiment of the present invention, the light sensor or sensors may be fitted to either the interior-facing, i.e. inside a room (FIG. 4A) or exterior-facing, i.e. outside a room (FIG. 4B) surface of the lock 1000.

The light sensor 210 may use pyranometer, solar, irradiance curves or other irradiance curves, such that a comparable energy input as seen by a one-junction or more photovoltaic cell(s) can be determined. The light sensor 210 may be fed into an energy harvesting manager 250, as described above, where information obtained from the light sensor can either be used locally, used and stored locally, or transmitted to a different component in the access control system where it can be used and stored. The resulting information obtained from the light sensor 210 may be used for management of power supply circuits or other system implementation. For example, the light source information may be used for building management to help ensure that a light source or sources is/are appropriate for a defined area, or may be used for diagnostic purposes, such as determining trends for the lock and to determine if the lock can be used with a photovoltaic power source cost effectively, e.g. the light sensor 210 provides the ability to sense and measure how much light energy is available to use, which measured quantity may be used to determine if harvesting the light energy, such as by using a photovoltaic cell or cells 220, is possible and/or advisable. The light sensor 210 may also be retrofitted to an existing lock or access control device and used to determine how efficient energy harvesting has been on pre-existing hardware. The light sensor(s) 210 may be optimized using methods to focus light from one or more sources, and/or may be optimized to determine from which source or sources the light energy is coming from. Implementations of the present invention may be for access control devices or electrically controlled locks that do not include photovoltaic cell(s), as described above, or for locks that include a light sensor in conjunction with photovoltaic cell(s) for harvesting some or all of the light energy detected by the light sensor.

Figure 5A:
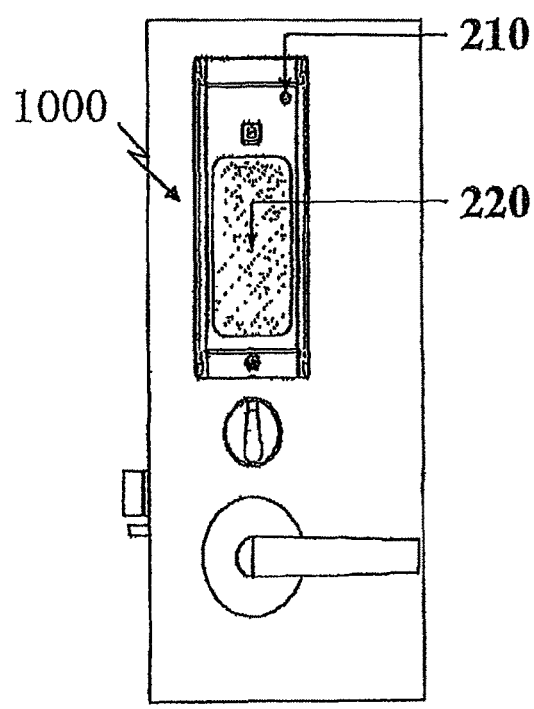
FIGS. 5A and 5B are exemplary embodiments of a door with an access control device including one or more light sensors in conjunction with photovoltaic cell(s) positioned on the interior (FIG. 5A) and exterior (FIG. 5B) surfaces, respectively, of the door.
Figure 5B:
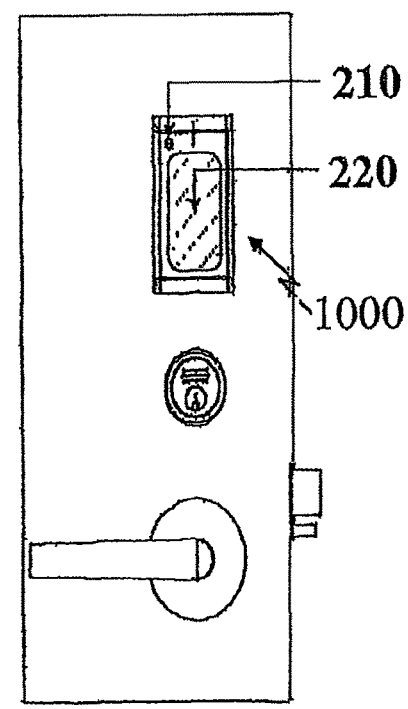

Referring now to FIGS. 5A and 5B, embodiments of the present invention including a light sensor or sensors 210 in conjunction with a photovoltaic cell or cells 220 are shown. As shown in the Figures, the photovoltaic cell or cells may be fitted to either the interior-facing, i.e. inside a room (FIG. 5A) or exterior-facing, i.e. outside a room (FIG. 5B) surface of the lock 1000, and may be on a permanent surface of the lock, as shown, or on a removable part of the lock. The photovoltaic cell or cells may be thin film or otherwise, and may be constructed of either single or multi-junction cells that give the ability to be optimized for either artificial light sources or natural light sources or both, or used to increase efficiency of energy conversion. In an embodiment, the light sources that are used are generally comprised of visible light, but light outside this spectrum is not excluded. The photovoltaic cell or cells 220 may be designed to be optimized to maximize energy received from either natural or artificial light sources by setting an angle of incidence with respect to their light sources. Methods to focus light from one or more sources may be used to optimize utility of available light sources. For implementations of a lock with a light sensor and a photovoltaic cell or cells, as shown in FIGS. 5A and 5B, the light sensor 210 may be used to manage and optimize the efficiency of the energy harvesting from the light sources. In certain embodiments, the implementation of a light sensor with a photovoltaic cell and the power supply may be used in a larger system that may potentially control sources of light, such as issuing a system warning to ensure that window blinds or shades are left open or opened to a certain degree for a specified period of time to help recharge a secondary energy storage, as described above. Such blinds or shades 270 are shown in FIG. 3 and may be controlled by energy harvesting manager 250 to open or close the blinds or shades to a desired degree to control the amount of natural light 400 that reaches photovoltaic cell(s) 220.

Figure 6:
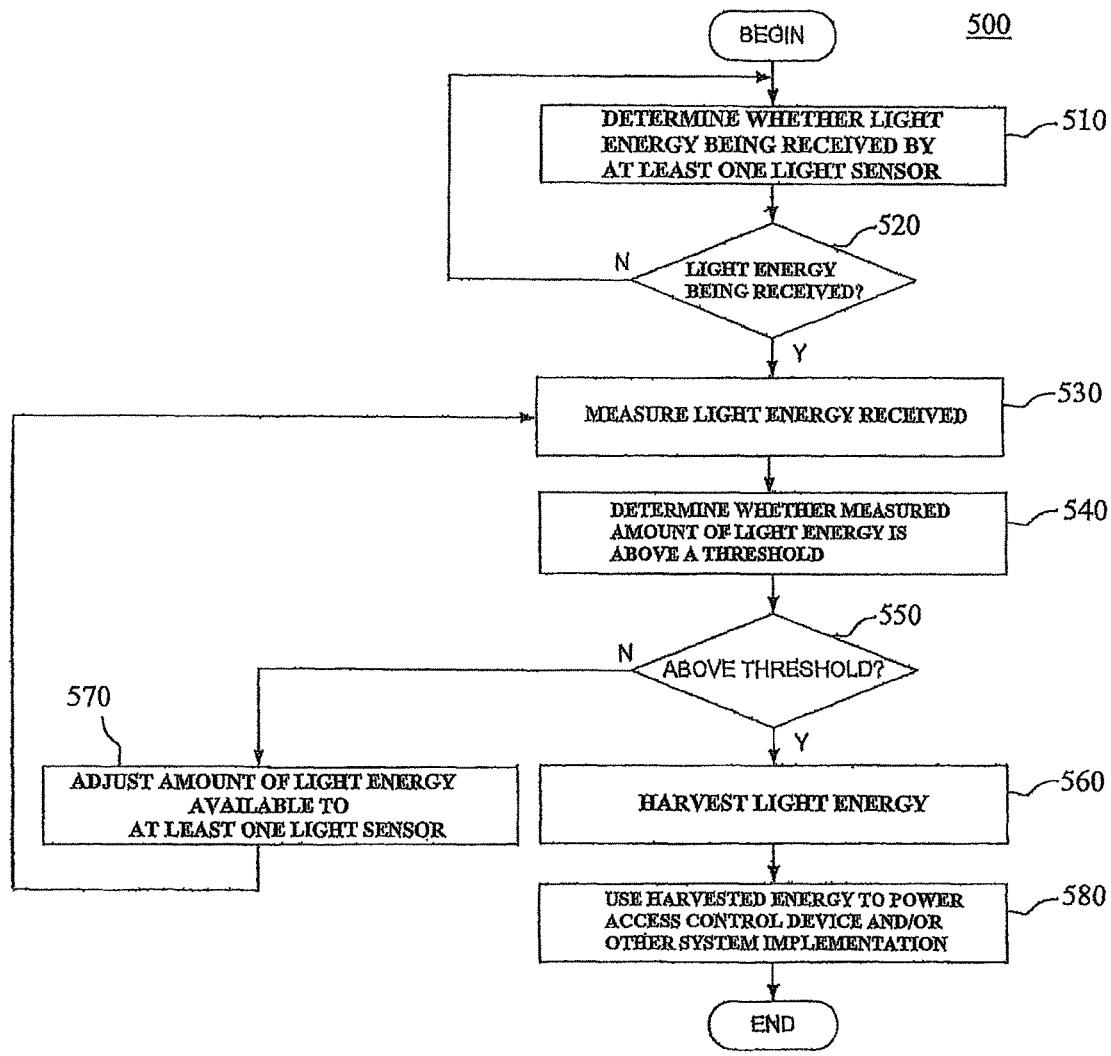
FIG. 6 is a process flow diagram showing the steps performed by the system of the present invention to manage and utilize light energy received from one or more light sources, according to various embodiments of the present teachings.

FIG. 6 illustrates an exemplary methodology and/or flow diagram of processing 500 performed by the system of the present invention to manage and utilize light energy harvested from identified energy sources in accordance with embodiments of the present invention. In various embodiments, one or more components of the system, such as energy harvesting manager 250, can perform processing 500, or other similar processes to manage energy harvested from one or more identified energy sources to power an access control device or for other system implementation. For simplicity of explanation, the methodologies are depicted and described as a series of acts. It is to be understood and appreciated that the subject innovation is not limited by the acts illustrated and/or by the order of acts. For example, acts can occur in various orders and/or concurrently, and with other acts not presented and described herein. Furthermore, not all illustrated acts may be required to implement the methodologies in accordance with the claimed subject matter. In addition, those skilled in the art should understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

In various embodiments, system 200 can perform processing 500, as shown in FIG. 6, to manage and utilize light energy provided by one or more identified light sources. At step 510, energy harvesting manager 250 can determine whether or not light energy is being received by at least one light sensor 210. In configurations where the system includes more than one light sensor, energy harvesting manager 250 can monitor the availability of light energy being received by each, some, or all of the light sensors 210. Next, at step 520, if energy harvesting manager 250 has determined that no light sensor is receiving light energy, then processing 500 can either return to step 510 or terminate. Alternatively, if energy harvesting manager 250 has determined that light energy is being received by at least one light sensor, then processing 500 can proceed to step 530. At step 530, energy harvesting manager 250 measures the amount of light energy received by the one or more light sensors 210 and may either use the information locally, store the information locally for later use, or transmit the information to another component in the system where it can be used and/or stored.

At steps 540 and 550, energy harvesting manager 250 can determine whether or not a potential or power level (e.g., voltage, amperage, and/or wattage) of the light energy received is above a threshold, and determine whether there is sufficient light energy available to harvest the energy. Energy harvesting manager 250 can use this measured quantity to optimize the efficiency of the energy harvesting from its light sources 210. At step 570, if energy harvesting manager 250 has determined that the measured amount of light energy received is not above a threshold, light sensors 210 may be optimized by transmitting a signal from energy harvesting manager 250 to another component in the access control system to focus light from one or more light sources by adjusting the amount of light energy available to at least one light sensor, for example, by adjusting the position of window blinds or shades 270 in a room (FIG. 3). Processing 500 may then return to step 530 and repeat steps 530 through 550 until the potential of the light energy received is above a threshold, or processing 500 may terminate.

At step 560, energy harvesting manager 250 can harvest some or all of the available light energy using one or more energy harvesters, such as one or more photovoltaic cells 220, and manage the harvested energy. In configurations where the system includes multiple harvesters, energy harvesting manager 250 can monitor the power level of energy being harvested by each, some, or all of the harvesters. Energy harvesting manager 250 can manage the harvested energy by conditioning the harvested energy, such as by rectifying, smoothing, stepping up, and/or stepping down the voltage of the harvested energy. Energy harvesting manager 250 can also manage the harvested energy by combining the harvested energy with energy from one or more other sources, such as a primary power source, e.g. a battery, for powering an access control device. In configurations where the system includes multiple harvesters, energy harvesting manager 250 can combine the energy harvested by some or all of the harvesters. Energy harvesting manager 250 can further manage harvested energy by switching between the harvested energy and energy from another source, such as a primary power source, to power an access control device based on the availability of the harvested energy and power demands of the access control device. In one or more embodiments, energy harvesting manager 250 can further manage harvested energy by using harvested energy to charge a secondary energy storage, such as a rechargeable battery or capacitor, which can then be used to power an access control device directly or to supplement a primary power supply. Finally, at step 580, energy harvesting manager 250 can use the harvested energy to power an access control device and/or for other system implementation, and then processing 500 can terminate.

The foregoing description is illustrative, and variations in configuration and implementation may occur to persons skilled in the art. For instance, the various illustrative logics, logical blocks, modules, and circuits described in connection with the embodiments disclosed herein can be implemented or performed with a general purpose processor, a digital signal processor ("DSP"), an application specific integrated circuit, a field programmable gate array or other programmable logic device, discrete gate or transistor logic, discrete hardware components, or any combination thereof designed to perform the functions described herein. A general-purpose processor can be a microprocessor, but, in the alternative, the processor can be any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described herein to be performed by the energy harvesting manager and other devices used in the invention can be implemented in hardware, software, firmware, or any combination thereof. For a software implementation, the techniques described herein can be implemented with modules (e.g., procedures, functions, subprograms, programs, routines, subroutines, modules, software packages, classes, and so on) that perform the functions described herein. A module can be coupled to another module or a hardware circuit by passing and/or receiving information, data, arguments, parameters, or memory contents. Information, arguments, parameters, data, or the like can be passed, forwarded, or transmitted using any suitable means including memory sharing, message passing, token passing, network transmission, and the like. The software codes can be stored in memory units and executed by processors. The memory unit can be implemented within the processor or external to the processor, in which case it can be communicatively coupled to the processor via various means as is known in the art.

If implemented in software, the functions may be stored on or transmitted over a computer-readable medium as one or more instructions or code. Computer-readable media includes both tangible computer storage media and communication media including any medium that facilitates transfer of a computer program from one place to another. A storage media may be any available tangible media that can be accessed by a computer. By way of example, and not limitation, such tangible computer-readable media can comprise RAM, ROM, flash memory, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, DVD, floppy disk and blu-ray disc where disks usually reproduce data magnetically, while discs reproduce data optically with lasers. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Combinations of the above should also be included within the scope of computer-readable media. Resources described as singular or integrated can in one embodiment be plural or distributed, and resources described as multiple or distributed can in embodiments be combined.

Thus, the present invention achieves one or more of the following advantages. The present invention provides a system which optimizes available energy sources for use in access control systems by monitoring available environmental and non-environmental energy sources using one or more energy source sensors to determine if energy harvesting is possible and/or advisable. The system of the present invention further increases the efficiency of energy harvesting by optimizing available energy sources. The present invention further provides an improved method for managing available energy sources in an access control system and for managing power supply circuits in an access control system using harvested energy.

While the present invention has been particularly described, in conjunction with specific embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A system for measuring harvested energy for use in an access control system, comprising:
   an access control device adapted to be at least partially powered by energy harvested from at least one energy source;
   at least one sensor receiving energy from the at least one energy source;
   an energy harvesting manager coupled to the at least one sensor, wherein the energy harvesting manager manages the amount of energy received by the at least one sensor;
   a capacitive storage device coupled to the energy harvesting manager, the capacitive storage device for storing energy harvested from the at least one sensor; and
   a microprocessor comprising program instructions that when executed cause the microprocessor to perform the steps of:
      charging the capacitive storage device to a voltage high threshold, V-HTH;
      applying a reference load to the capacitive storage device until the capacitive storage device discharges to a predetermined voltage value, Vole, the reference load having a predetermined resistance value;
      determining a time constant, the time constant defined as the length of time required for the capacitive storage device to discharge to the predetermined voltage value, $V_o/e$;
      determining an exact or near exact capacitance of the capacitive storage device by comparing the time constant to the reference load predetermined value, by the expression:

$$C=RC/RL$$

where,
         C=capacitance (in farads);
         RC=time constant (in seconds); and
         RL=reference load resistance (in ohms);
      discharging the capacitive storage device to a voltage low threshold, V-LTH; and
      determining an amount of energy used per charge unloaded, CnL, of the capacitive storage device by comparing the voltage high threshold, V-HTH, and the voltage low threshold, V-LTH, by the expression:

$$CnL=(0.5*C*(V\text{-}LTH^2-V\text{-}HTH^2))/3600$$

where,
         CnL=energy (in watt hours);
         C=capacitance (in farads);
         V-LTH=voltage low threshold (in volts); and
         V-HTH=voltage high threshold (in volts).

2. The system of claim 1 wherein the microprocessor is further adapted to perform the steps of:
   calculating a charge time, CtnL, without applying the reference load, defined as the time required to charge the capacitive storage device to the voltage high threshold, V-HTH;
   charging the capacitive storage device using at least one pulse of current having a duration of between about 150 milliseconds and 500 milliseconds and determining the total charge time, CCt;
   estimating the amount of energy used per pulse capacitor charge, PCC, by the expression:

$$PCC=(CCt/CtnL)*CnL$$

where,
      PCC=energy (in Wh);
      CCt=total charge time (in seconds);
      CtnL=charge time no load (in seconds); and
      CnL=charge no load (in watt hours);
   and
   plotting the PCC on an exponential correlation curve to charge time.

3. A method for measuring energy harvested from at least one energy source for use in an access control system including an access control device adapted to be at least partially powered by energy harvested from the at least one energy source, comprising:
   charging a capacitive storage device to a voltage high threshold, V-HTH, the capacitive storage device for storing energy harvested from at least one sensor receiving energy from at least one energy source, the capacitive storage device coupled to an energy harvesting manager adapted for managing the amount of energy received by the at least one sensor;
   applying a reference load to the capacitive storage device until the capacitive storage device discharges to a predetermined voltage value, Vole, the reference load having a predetermined resistance value;
   determining a time constant, the time constant defined as the length of time required for the capacitive storage device to discharge to the predetermined voltage value, $V_o/e$;
   determining an exact or near exact capacitance of the capacitive storage device by comparing the time constant to the reference load predetermined value, by the expression:

$$C=RC/RL$$

where,
      C=capacitance (in farads);
      RC=time constant (in seconds); and
      RL=reference load resistance (in ohms);
   discharging the capacitive storage device to a voltage low threshold, V-LTH; and
   determining an amount of energy used per charge unloaded, CnL, of the capacitive storage device by comparing the voltage high threshold, V-HTH, and the voltage low threshold, V-LTH, by the expression:

$$CnL=(0.5*C*(V\text{-}LTH^2-V\text{-}HTH^2))/3600$$

where,
      CnL=energy (in watt hours);
      C=capacitance (in farads);
      V-LTH=voltage low threshold (in volts); and
      V-HTH=voltage high threshold (in volts).

4. The method of claim 3 further comprising the steps of:
   calculating a charge time, CtnL, without applying the reference load, defined as the time required to charge the capacitive storage device to the voltage high threshold, V-HTH;
   charging the capacitive storage device using at least one pulse of current having a duration of between about 150 milliseconds and 500 milliseconds and determining the total charge time, CCt;
   estimating the amount of energy used per pulse capacitor charge, PCC, by the expression:

$$PCC=(CCt/CtnL)*CnL$$

where,
      PCC=energy (in Wh);
      CCt=total charge time (in seconds);

CtnL=charge time no load (in seconds); and
CnL=charge no load (in watt hours);
and
plotting the PCC on an exponential correlation curve to charge time.

* * * * *

UNITED STATES PATENT AND TRADEMARK OFFICE
CERTIFICATE OF CORRECTION

PATENT NO. : 10,438,978 B2  
APPLICATION NO. : 15/465232  
DATED : October 8, 2019  
INVENTOR(S) : Mark Bryla, Michael Lorello and John C. Wren Page 1 of 1

It is certified that error appears in the above-identified patent and that said Letters Patent is hereby corrected as shown below:

On the Title Page

In the Abstract, Line 14, after constant, delete ", the time constant".

Under abstract "4 Claims, 9 Drawing Sheets" should read --4 Claims, 8 Drawing Sheets--.

In the Drawings

Sheet 9, Figs. 11A to 11C, delete Sheet 9 of 9.

In the Claims

In Claim No. 1, Column 17, Line 26, delete "Vole" and substitute therefore --$V_o/e$--.

In Claim No. 3, Column 18, Line 23, delete "Vole" and substitute therefore --$V_o/e$--.

Signed and Sealed this  
Eleventh Day of February, 2020

Andrei Iancu  
*Director of the United States Patent and Trademark Office*